(12) United States Patent
Lee et al.

(10) Patent No.: US 6,870,205 B2
(45) Date of Patent: Mar. 22, 2005

(54) SCALABLE HIERARCHICAL I/O LINE STRUCTURE FOR A SEMICONDUCTOR MEMORY DEVICE

(75) Inventors: Jae-woong Lee, Seoul (KR); Jong-hak Won, Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/337,693

(22) Filed: Jan. 7, 2003

(65) Prior Publication Data

US 2003/0132457 A1 Jul. 17, 2003

(30) Foreign Application Priority Data

Jan. 16, 2002 (KR) .......................................... 2002-2508

(51) Int. Cl.[7] .............................................. H01L 27/10
(52) U.S. Cl. ....................... 257/202; 257/296; 257/297; 257/365; 257/288; 257/206; 257/208
(58) Field of Search ................................ 257/202, 296, 257/297, 298, 365, 366, 288, 206, 208

(56) References Cited

U.S. PATENT DOCUMENTS

2003/0058685 A1 * 3/2003 Tran et al. .................. 365/158

* cited by examiner

Primary Examiner—Nathan J. Flynn
Assistant Examiner—Remmon R. Fordé
(74) Attorney, Agent, or Firm—Myers Bigel Sibley & Sajovec

(57) ABSTRACT

A semiconductor memory device having a hierarchical I/O line structure is provided. The semiconductor memory array includes a memory cell array which is divided into a plurality of sub-arrays by sub-word line driver areas and bit line sense amplifier areas; local input/output (I/O) lines which are arranged in the bit line sense amplifier areas; and global I/O lines which are arranged in the sub-word line driver areas, wherein at least one end of each of the local I/O lines is formed in a bit line sense amplifier area. The semiconductor memory device may also have a dummy bit line sense amplifier area capable of dividing local I/O lines in a bit line sense amplifier area, and can reduce the number of sub-word line driver areas such that the chip size can be reduced.

22 Claims, 8 Drawing Sheets

SCALABLE HIERARCHICAL I/O LINE STRUCTURE FOR A SEMICONDUCTOR MEMORY DEVICE

RELATED APPLICATIONS

This application claims priority to Korean Patent Application No. 20020-002508, filed on Jan. 16, 2002, the contents of which are herein incorporated by reference in their entirety.

FIELD OF THE INVENTION

The present invention relates to a semiconductor memory device, and more particularly, to a semiconductor memory device having a hierarchical input/output (I/O) line structure.

BACKGROUND OF THE INVENTION

In general, in a memory cell array of a semiconductor memory device, for example, a Dynamic Random Access Memory (DRAM) semiconductor memory device, word lines and bit lines are arranged to perpendicularly intersect each other. Through a switching circuit, the bit lines are connected to I/O lines through which data is input or output. Each memory cell is typically arranged at one of the intersections of the bit lines and word lines. As the storage capacity of a semiconductor memory device increases, the memory cells and the peripheral circuit that controls data to be written to or to be read from the memory cells have generally become more highly integrated.

For high speed operation of the I/O lines, the I/O lines embedded in the semiconductor memory device may have a hierarchical I/O line structure in which the I/O lines are divided into local I/O lines and global I/O lines. Likewise, in order to reduce signal delays due to the resistance of poly-silicon used as word lines, a hierarchical word line structure in which word lines are divided into main word lines and sub-word lines may have also been widely used.

Conventionally, the number of sub-arrays arranged in length on the matrix of a memory cell array is 16. Recently, however, in order to reduce the size of a chip while maintaining the same storage capacity, the number of sub-arrays arranged in length has been reduced to 14 or 12.

FIG. 1 is a partial layout diagram of a semiconductor memory device having a conventional hierarchical I/O line structure. Referring to FIG. 1, the semiconductor memory device 10 has a memory cell array containing a plurality of sub-arrays 11, a column decoder 12 and a row decoder 13. A sub-array 11 has a plurality of memory cells.

The memory cell array may be divided into 96 (=12×8) sub-arrays 11 by bit line sense amplifier areas 14 and sub-word line driver areas 15. The bit line sense amplifier areas 14 are repeatedly arranged in the column direction, while the sub-word line driver areas 15 are repeatedly arranged in the row direction. In a bit line sense amplifier area 14, a bit line sense amplifier (not shown) is arranged, while in a sub-word line driver area 15 a sub-word line driver (not shown) driving a sub-word line is arranged.

The semiconductor memory device 10 has a hierarchical word line structure. That is, a plurality of Main Word Lines (MWLs) are connected to the row decoder 13, crossing over 12 of the sub-arrays 11 in the column direction, and each of a plurality of sub-word lines (not shown) which are connected to the MWLs through a predetermined driver are arranged on a sub-array 11. In response to a row address, the row decoder 13 selects and activates MWLs. MWLs are also referred to as Normal Word Lines (NWLs).

A plurality of Column Selection Lines (CSLs) are connected to the column decoder 12, crossing over 8 of the sub-arrays 11 in the row direction. The column decoder 12 selects and activates the CSLs.

The semiconductor memory device 10 has a hierarchical I/O line structure. For each 3 of the sub-arrays 11, a pair of Local I/O lines (LIO) are provided. Usually, as shown in FIG. 1, a LIO is divided into 4 segments or a multiple of 4 segments. After being divided in conjunction areas where the bit line sense amplifier areas 14 and the sub-word line driver areas 15 intersect, the LIOs are repeatedly arranged in the column direction. A LIO that is arranged in a bit line sense amplifier area 14 is commonly used by the two sub-arrays 11 arranged one at either side of the LIO. A pair of Global I/O lines (GIO) are connected to the LIOs through switching circuits, and for each 3 of the sub-arrays 11 arranged in the column direction, a GIO is repeatedly arranged on a sub-word line driver area. Each of the switching circuits is arranged at an intersection area 16 where a GIO and the LIOs intersect each other.

FIG. 2 is a detailed diagram of region A in which pairs of local I/O lines shown in FIG. 1 are divided.

The sub-arrays 11 are divided by the Bit Line Sense Amplifier areas (BL S/A) and Sub-Word line Driver areas (SWD). On each of the sub-arrays 11, a plurality of Sub-Word Lines (SWL) and a plurality of pairs of Bit Lines (BL) are arranged intersecting each other. A memory cell is arranged at intersection areas where a SWL and a BL intersect each other. A sub-word line driver (not shown) driving a SWL is arranged in a SWD, and a bit line sense amplifier that is connected to a BL is arranged in a BL S/A.

An LIO is divided in a conjunction area (CONJUNCTION) and is arranged in a BL S/A, perpendicularly intersecting BLs. In the conjunction area, a control circuit is provided that controls the SWD and the BL S/A.

However, when the size of a chip is reduced while maintaining the same data storage capacity, for example, when 10 sub-arrays having relatively larger data storage capacity than the sub-arrays 11 of the conventional semiconductor memory device are arranged in the column direction such that the chip size is reduced, it may be necessary to divide the LIO, not in the conjunction area, but in the BL S/A. However, since the area needed to divide the LIO on the BL S/A is typically too small, the LIO typically cannot be divided in the BL S/A, and it may be difficult to implement a hierarchical I/O line structure.

SUMMARY OF THE INVENTION

Embodiments of the present invention provide a semiconductor memory device that may reduce the size of a chip by dividing a pair of local I/O lines in a bit line sense amplifier area while maintaining the continuity of a memory cell array, a bit line sense amplifier and a column decoder.

In particular embodiments of the present invention, a semiconductor memory array includes a memory cell array divided into a plurality of sub-arrays by sub-word line driver areas and bit line sense amplifier areas. Local Input/Output (I/O) lines are arranged in the bit line sense amplifier areas and global I/O lines are arranged in the sub-word line driver areas. At least one end of each of the local I/O lines is formed in a bit line sense amplifier area.

In further embodiments of the present invention, the bit line sense amplifier areas include dummy bit line sense amplifier areas containing dummy bit line sense amplifiers. In such embodiments, at least one end of each of the local I/O lines may be provided in a dummy bit line sense amplifier area. Furthermore, a first switching circuit responsive to a column selection signal that selectively connects or disconnects a respective local I/O line and a dummy bit line connected to the corresponding dummy bit line sense amplifier may also be provided. For example, the first switching circuit may disconnect the respective local I/O line and the dummy bit line connected to the dummy bit line sense amplifier in response to inactivation of the column selection line signal.

In still further embodiments of the present invention, the local I/O line arranged in the bit line sense amplifier area is formed with a first divided local I/O line and a second divided local I/O line. The first divided local I/O line is connected to a first global I/O line through a second switching circuit and the second divided local I/O line is connected to a second global I/O line through a third switching circuit.

The semiconductor memory array may also include a column decoder that generates a column selection signal. The column decoder may be provided by a column decoding circuit configured to decode a column address provided to the semiconductor memory device and a plurality of driver circuits configured to selectively provide a corresponding column selection signal. In particular embodiments of the present invention, each of the plurality of driver circuits includes a latch circuit that latches a logic value based on a voltage level of an input node, a transistor, responsive to a control signal indicating that power is provided to the semiconductor memory device, that is configured to selectively pull down the voltage level of the input node of the latch circuit to a ground voltage, an inverter configured to invert an output signal of the latch circuit as a column selection line signal and a fuse configured to selectively allow or prevent sending a signal output from the column decoding circuit to the input node of the latch circuit.

In other embodiments of the present invention, a semiconductor memory device includes a memory cell array divided into a plurality of sub-arrays by sub-word line driver areas and bit line sense amplifier areas. A plurality of sub-word lines are arranged in each of the sub-arrays. A plurality of normal bit line pairs are arranged on each of the sub-arrays, respective ones of which perpendicularly intersect each of the sub-word lines. A dummy bit line pair is arranged in each of the sub-arrays, respective ones of which perpendicularly intersect each of the sub-word lines. The dummy bit line pairs are arranged in parallel with corresponding ones of the normal bit line pairs. A plurality of dummy bit line sense amplifiers are connected to corresponding ones of the dummy bit line pairs and arranged in a corresponding bit line sense amplifier area. A plurality of local I/O line pairs are connected to a corresponding normal bit line pair and a corresponding dummy bit line pair through a respective one of a plurality of first switching circuits. A plurality of global I/O line pairs are connected to corresponding local I/O line pairs through a respective one of a plurality of second switching circuits. At least one end of each of the local I/O line pairs is formed in a corresponding one of the bit line sense amplifier areas.

In additional embodiments of the present invention, each of the first switching circuits, in response to inactivation of the corresponding column selection line signal, disconnects corresponding ones of the dummy bit line pairs from the local I/O line pairs corresponding to the dummy bit line pair. Furthermore, each of the local I/O line pairs arranged in the dummy bit line sense amplifier area may be formed with first divided local I/O line pairs and second divided local I/O line pairs. The first divided local I/O line pairs may be connected to first global I/O line pairs among the global I/O line pairs through one of the second switching circuits, and the second divided local I/O line pairs may be connected to second global I/O line pairs among the global I/O line pairs through one of the second switching circuits.

The semiconductor memory device may also include a column decoder that generates a column selection signal. The column decoder may be provided by a column decoding circuit configured to decode a column address provided to the semiconductor memory device and a plurality of driver circuits configured to selectively provide a corresponding column selection signal. In particular embodiments of the present invention, each of the plurality of driver circuits includes a latch circuit that latches a logic value based on a voltage level of an input node, a transistor, responsive to a control signal indicating that power is provided to the semiconductor memory device, that is configured to selectively pull down the voltage level of the input node of the latch circuit to a ground voltage, an inverter configured to invert an output signal of the latch circuit as a column selection line signal and a fuse configured to selectively allow or prevent sending a signal output from the column decoding circuit to the input node of the latch circuit.

In yet other embodiments of the present invention, a semiconductor memory device includes a memory cell array divided into a plurality of sub-arrays by sub-word line driver areas and bit line sense amplifier areas, a plurality of sub-word lines arranged in the sub-arrays, a plurality of normal bit line pairs which are arranged on the sub-arrays and perpendicularly intersect the sub-word lines, a dummy bit line pair in each of the sub-arrays in parallel with the normal bit line pairs and configured to perpendicularly intersect the sub-word lines and a plurality of dummy bit line sense amplifiers connected to corresponding ones of the dummy bit line pairs and arranged in corresponding ones of the bit line sense amplifier areas. A plurality of local I/O line pairs are also provided. Ones of the local I/O line pairs are connected to a normal bit line pair and a corresponding dummy bit line pair. First switching circuits are configured to selectively connect or disconnect corresponding ones of the local I/O line pairs and the dummy bit line pairs. Each of the local I/O line pairs is divided into first divided local I/O line pairs and second divided local I/O line pairs in a bit line sense amplifier area in which the dummy bit line sense amplifier is arranged, and each of the first switching circuits is controlled by a column selection line signal of a column selection line. In further embodiments, each of the first switching circuits includes at least two NMOS transistors. Furthermore, the dummy bit line pair connected to the first divided local I/O line pairs and the dummy bit line pair connected to the second divided local I/O line pairs may be arranged on an identical sub-array.

In still other embodiments of the present invention, a semiconductor memory device includes a memory cell array having a plurality of sub-arrays, bit line sense amplifier areas between the sub-arrays and a first divided local I/O line in at least one of the bit line sense amplifier areas. An end of the first divided local I/O line is formed in the bit line sense amplifier area. Furthermore, at least one of the bit line sense amplifier areas may include a dummy bit line sense amplifier area. The semiconductor memory device may also include a second divided local I/O line. An end of the second divided local I/O line may be formed in the dummy bit line sense amplifier area. An end of the first divided local I/O line and an end of the second divided local I/O line may also be arranged in the dummy bit line sense amplifier area.

BRIEF DESCRIPTION OF THE DRAWINGS

The above objects and advantages of the present invention will become more apparent by describing in detail preferred embodiments thereof with reference to the attached drawings in which.

DESCRIPTION OF THE PREFERRED EMBODIMENTS

The present invention will now be described more fully with reference to the accompanying drawings, in which preferred embodiments of the invention are shown. This invention may, however, be embodied in many different forms and should not be construed as being limited to the embodiments set forth herein. Rather, these embodiments are provided so that this disclosure will be thorough and complete, and will fully convey the concept of the invention to those skilled in the art.

Figure 1:
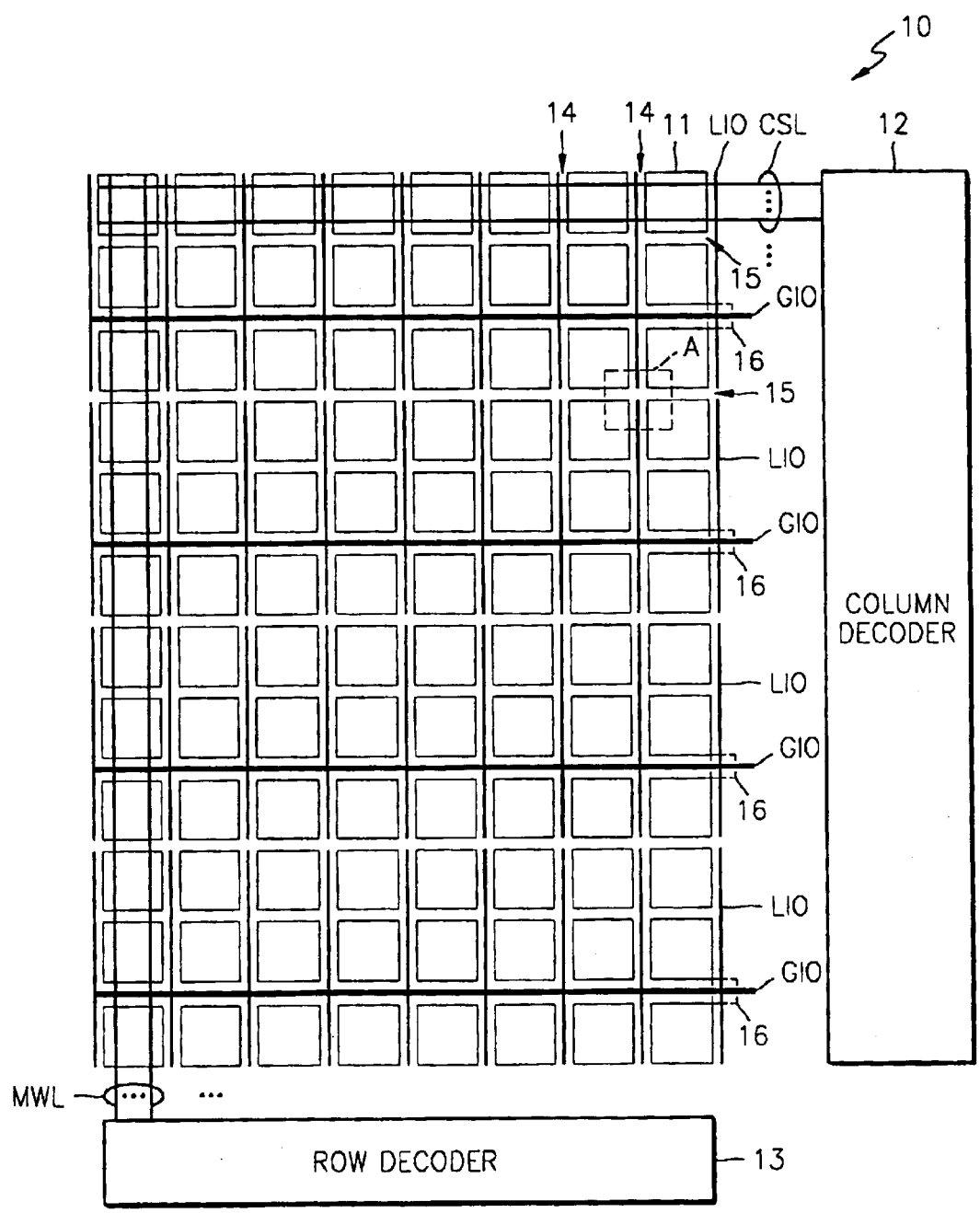
FIG. 1 is a partial layout diagram of a conventional semiconductor memory device having a hierarchical I/O line structure.
Figure 2:
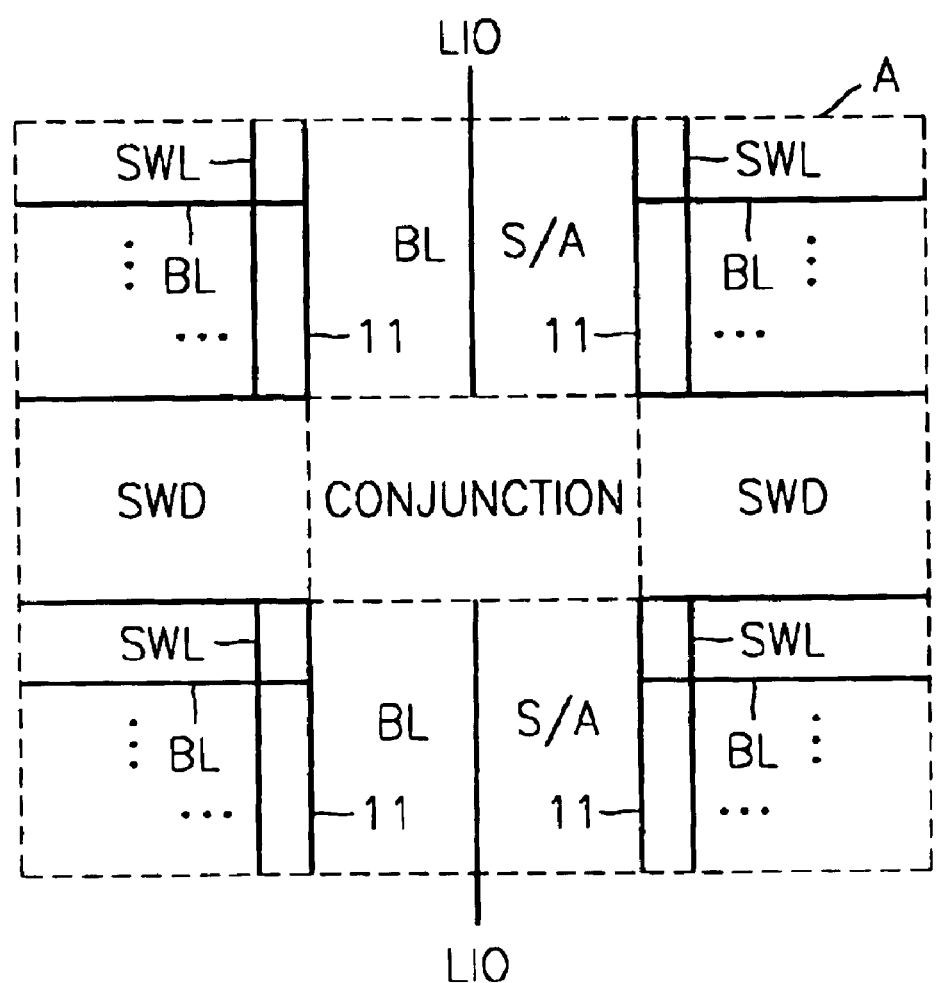
FIG. 2 is a detailed diagram of a portion of a semiconductor memory device including pairs of local I/O lines shown in FIG. 1.
Figure 3:
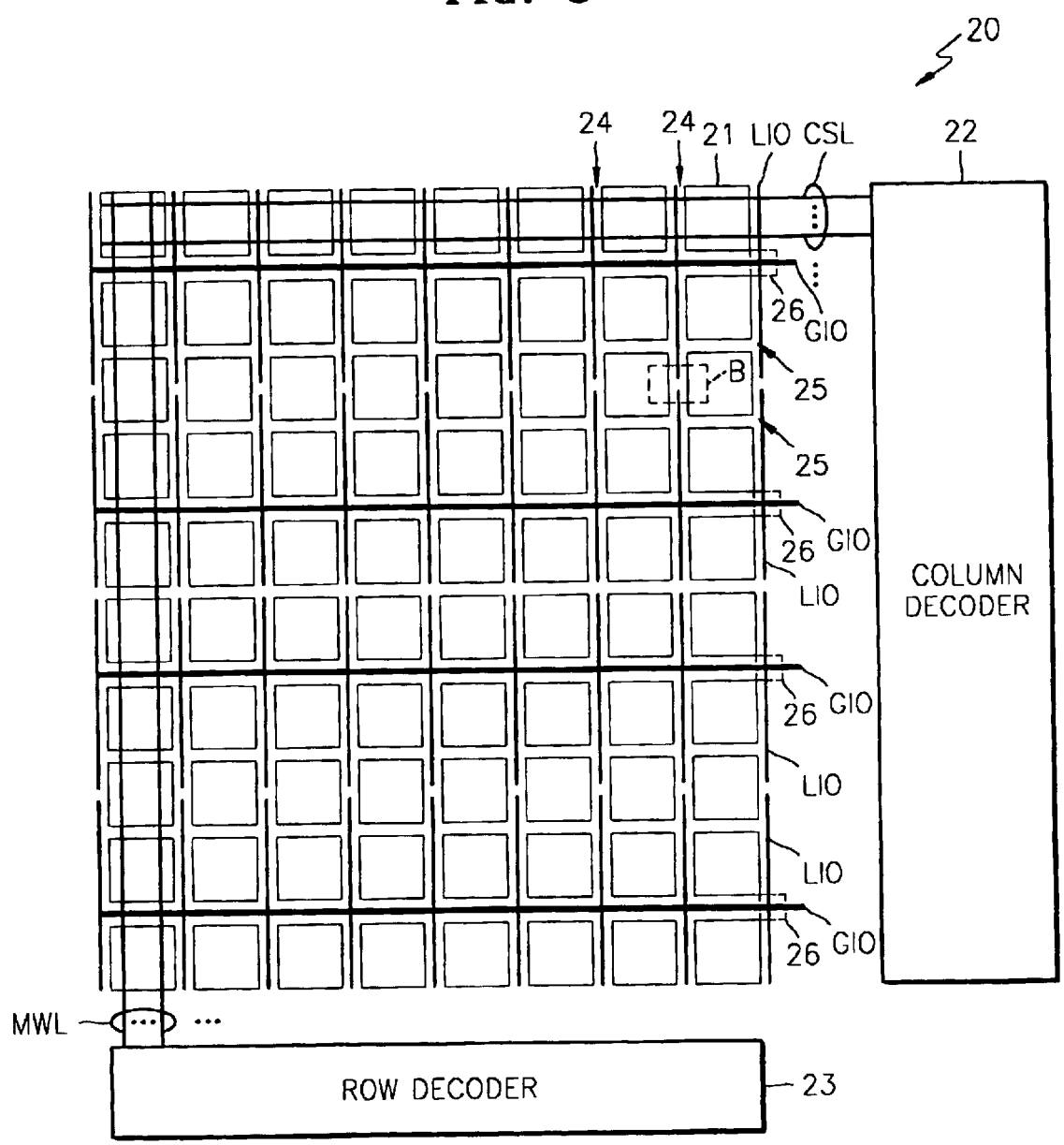
FIG. 3 is a partial layout diagram of a semiconductor memory device having a hierarchical I/O line structure according to embodiments of the present invention.

Referring to FIG. 3, a semiconductor memory device 20 according to embodiments of the present invention includes a memory cell array having a plurality of sub-arrays 21, a column decoder 22, and a row decoder 23. The data storage capacity of the sub-arrays 21 may be larger than that of the sub-arrays 11 shown in FIG. 1.

In certain embodiments, the memory cell array is divided into 80 (=10×8) sub-arrays by the bit line sense amplifier areas 24 and the sub-word line driver areas 25. The bit line sense amplifier areas 24 are repeatedly arranged in the column direction, while the sub-word line driver areas 25 are repeatedly arranged in the row direction. In a bit line sense amplifier area 24, a bit line sense amplifier (not shown) is arranged, while in a sub-word line driver area 25 a sub-word line driver (not shown) driving a sub-word line is arranged.

The semiconductor memory device 20 according to certain embodiments of the present invention has a hierarchical word line structure. That is, a plurality of Main Word Lines (MWLs) are connected to the row decoder 23, crossing over 10 of the sub-arrays 21 in the column direction, and each of a plurality of sub-word lines (not shown) which are connected to the MWLs through the sub-word line drivers are arranged on a sub-array 21. In response to a row address, the row decoder 23 selects and activates MWLs. MWLs are also referred to as Normal Word Lines (NWLs).

A plurality of Column Selection Lines (CSLs) are connected to the column decoder 22 and cross over 8 of the sub-arrays 11 in the row direction. The column decoder 12 selects and activates CSLs.

The semiconductor memory device 20 according to embodiments of the present invention may also have a hierarchical I/O line structure. For each 2.5 of the sub-arrays 21, an LIO is divided and repeatedly arranged in the column direction in a bit line sense amplifier area 24. An LIO that is arranged in a bit line sense amplifier area 24 is commonly used by two of the sub-arrays 21 arranged one at either side of the LIO. A pair of Global I/O lines (GIO) is connected to LIOs through switching circuits (not shown). For each 2.5 of the sub-arrays 11 arranged in the column direction, a GIO is repeatedly arranged in the column direction on a sub-word line driver area. Each of the switching circuits is arranged at an intersection area 26 where a GIO and LIOs intersect each other.

Because the LIOs are divided in the bit line sense amplifier areas 24, the semiconductor memory device 20 according to embodiments of the present invention can reduce the overall chip size while maintaining about the same data storage capacity as the conventional semiconductor memory device 10.

Figure 4:
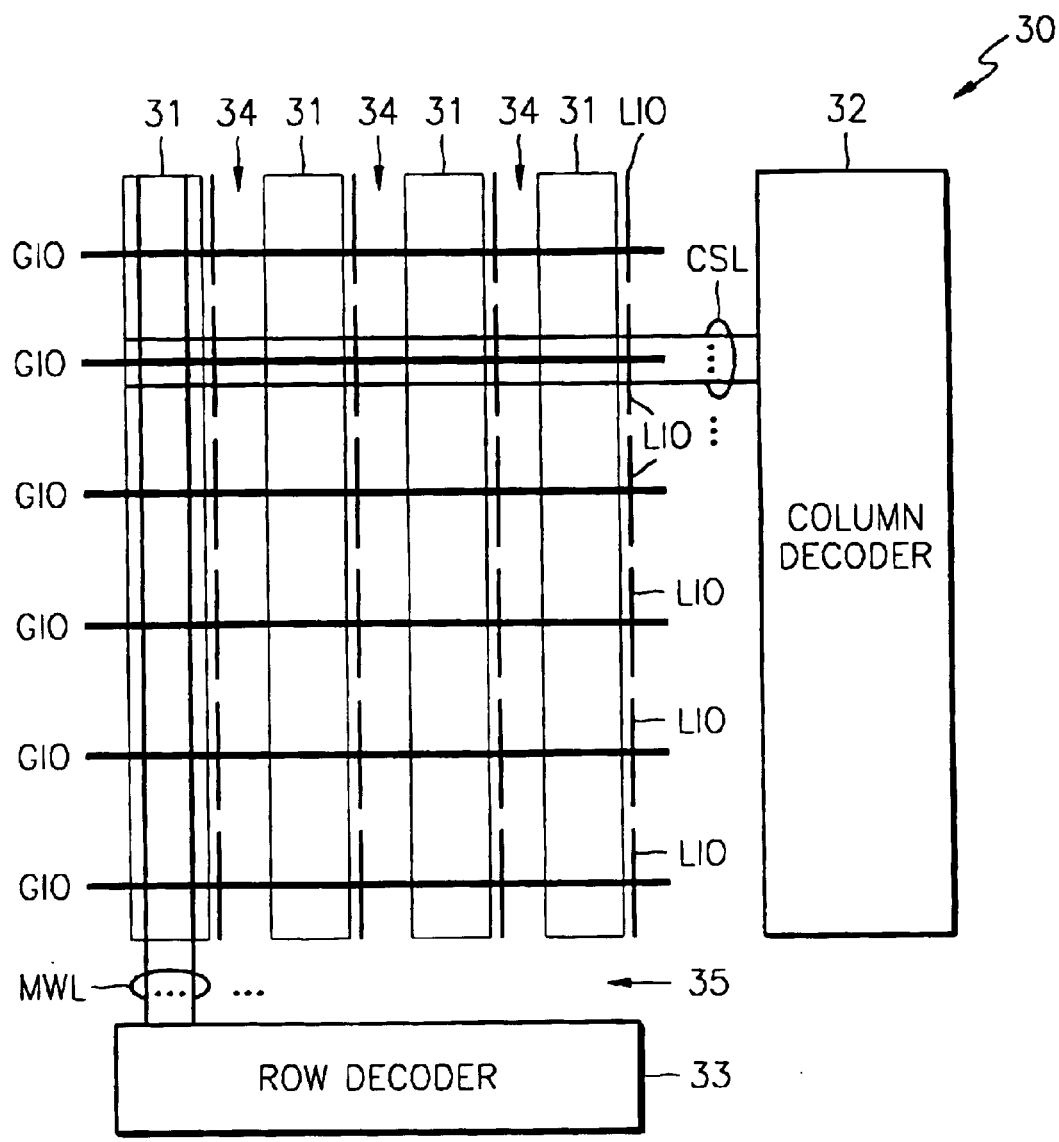
FIG. 4 is a partial layout diagram of a semiconductor memory device having a hierarchical I/O line structure according to further embodiments of the present invention.

FIG. 4 is a partial layout diagram of a semiconductor memory device 30 having a hierarchical I/O line structure according to further embodiments of the present invention. Referring to FIG. 4, the semiconductor memory device 30 has a memory cell array having a plurality of sub-arrays 31, a column decoder 32, and a row decoder 33. The functions of the column decoder 32 and row decoder 33 are the same as the column decoder 22 and row decoder 23 described with reference to FIG. 3.

The semiconductor memory device 30 shown in FIG. 4 has many components in common with the semiconductor memory device 20 shown in FIG. 3, and, therefore, differences between the two will be described in detail herein. Unlike the semiconductor memory device 20 of FIG. 3, the memory cell array of the semiconductor memory device 30 is divided by bit line sense amplifier areas 34 and a sub-word line driver area 35 is provided at the periphery of the memory cell array.

Figure 5:
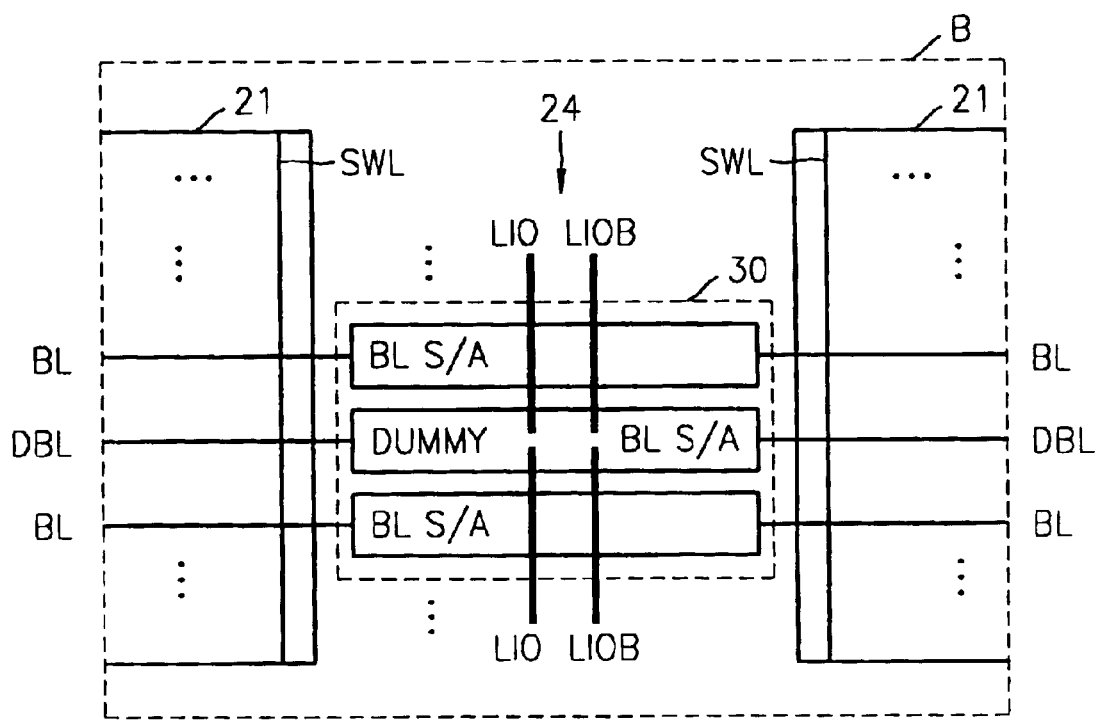
FIG. 5 is a detailed diagram of a portion of a semiconductor memory device in which pairs of local I/O lines shown in FIG. 3 are divided.

FIG. 5 is a detailed diagram of region B in which pairs of local I/O lines shown in FIG. 3 are divided. On each of the sub-arrays 21, a plurality of sub-word lines (SWLs) and a plurality of normal Bit Line pairs (BLs) are arranged perpendicularly intersecting each other. At an intersection area in which a SWL and a BL intersect, a memory cell is arranged. Dummy Bit Line pairs (DBLs) are arranged in parallel with the BLs. A memory cell is also arranged is the intersection area in which a SWL and a DBL intersect each other. Therefore, the continuity of the memory cell array included in the semiconductor memory device is maintained.

In the bit line sense amplifier area 24, Bit Line Sense Amplifier areas (BL S/As) and a Dummy Bit Line Sense Amplifier area (DUMMY BL S/A), collectively referenced as item 30, are formed.

Pairs of local I/O lines (LIO, LIOB) are divided in the DUMMY BL S/A and form a first divided LIO and a second divided LIO. The first divided LIO and the second divided LIO are connected to a first GIO (not shown) and a second GIO (not shown), respectively, through the switching circuits. The first divided LIO and the second divided LIO are arranged perpendicularly intersecting the BLs and DBLs.

Figure 6:
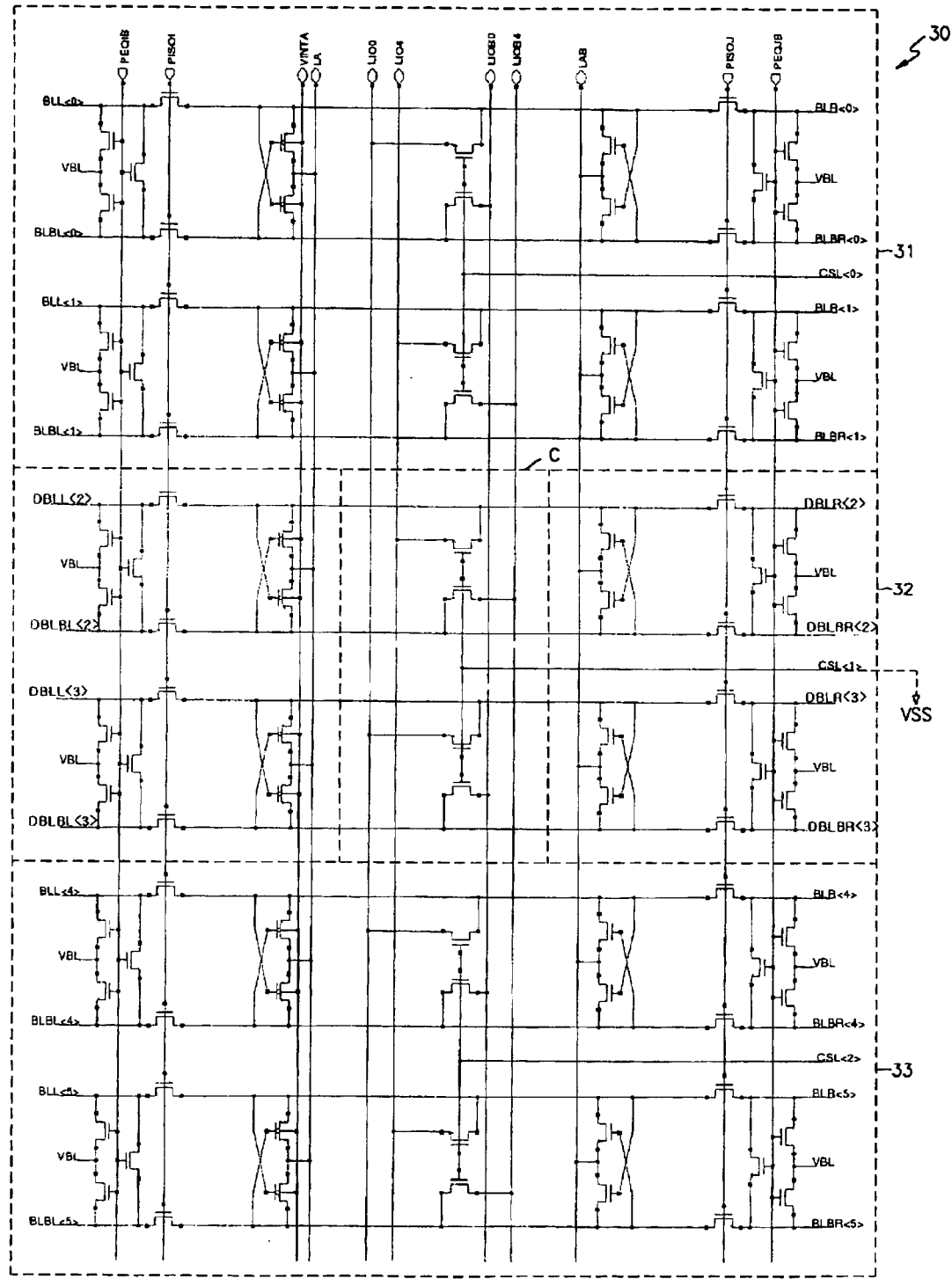
FIG. 6 is a detailed diagram of a bit line sense amplifier area in which pairs of local I/O lines shown in FIG. 5 are divided.

FIG. 6 is a detailed diagram of a portion of a bit line sense amplifier area 30 in which pairs of local I/O lines shown in FIG. 5 are divided. A structure using the LIOs shown in FIG. 5 is a 4 bit line pairs/CSL structure in which 4 bit line pairs correspond to one CSL.

As seen in FIG. 6, in a bit line sense amplifier area 31, a PMOS sense amplifier having PMOS transistors, an NMOS sense amplifier having NMOS transistors, two equalizing circuits, two isolation circuits, and 4 column selection switches are arranged.

In response to isolation signals (PISOI, PISOJ), the isolation circuits isolate bit line pairs ([BLL<0>, BLBL<0>], [BLL<1>, BLBL<1>]) that are arranged on the left, and bit line pairs ([BLR<0>, BLBR<0>], [BLR<1>, BLBR<1>]) that are arranged on the right. The isolated bit line pairs are selectively connected to local I/O line pairs ([LIO0, LIOB0], [LIO4, LIOB4]).

In response to equalizing signals (PEQIB, PEQJB), the equalizing circuits equalize the voltage of the bit line pairs to a predetermined voltage (VBL).

In response to a predetermined voltage (LA), the PMOS sense amplifier amplifies the voltage difference between each bit line pairs ([BLL<0>, BLBL<0>], [BLL<1>, BLBL<1>]) that are arranged on the left. A substrate voltage (VINTA) is provided to the substrates of the two PMOS transistors contained in the PMOS sense amplifier. In response to the inverted voltage (LAB) of the voltage (LA), the NMOS sense amplifier amplifies the voltage difference between each of the bit line pairs ([BLR<0>, BLBR<0>], [BLR<1>, BLBR<1>]) that are arranged on the right.

In response to a column selection line signal which activates/inactivates CSL<0>, each column selection switch connects/isolates the bit line pairs and the local I/O line pairs. Each column selection switch has an NMOS transistor.

Elements arranged on a bit line sense amplifier area 33 are the same as the elements of the bit line sense amplifier area 31 described above. However, the bit line sense amplifier area 33 is different in that reference numbers of bit line pairs and the column selection line are [BLL<4>, BLBL<4>], [BLL<5>, BLBL<5>], [BLR<4>, BLBR<4>], [BLR<5>, BLBR<5>]) and CSL<2>, respectively.

In addition, also in the dummy bit line sense amplifier area 32, the same elements as those of the bit line sense amplifier area 31 are arranged. However, the dummy bit line sense amplifier area 32 is different in that a column selection line (CSL<1>) connected to each column selection switch of the dummy bit line sense amplifier area 32 is connected to ground voltage (VSS) to keep an inactivated state, and the reference number of bit line pairs and the column selection line arranged in the dummy bit line sense amplifier area 32 are [DBLL<2>, DBLBL<2>], [DBLL<3>, DBLBL<3>], [DBLR<2>, DBLBR<2>], [DBLR<3>, DBLBR<3>]) and CSL<1>. Therefore, the continuity of the bit line sense amplifier included in the semiconductor memory device of the present invention is also maintained.

The column selection line (CSL<1>) may be connected to the ground voltage (VSS) in the column decoder (not shown) contained in the semiconductor memory device according to particular embodiments of the present invention, and this will be explained with reference to FIG. 8.

Figure 7:
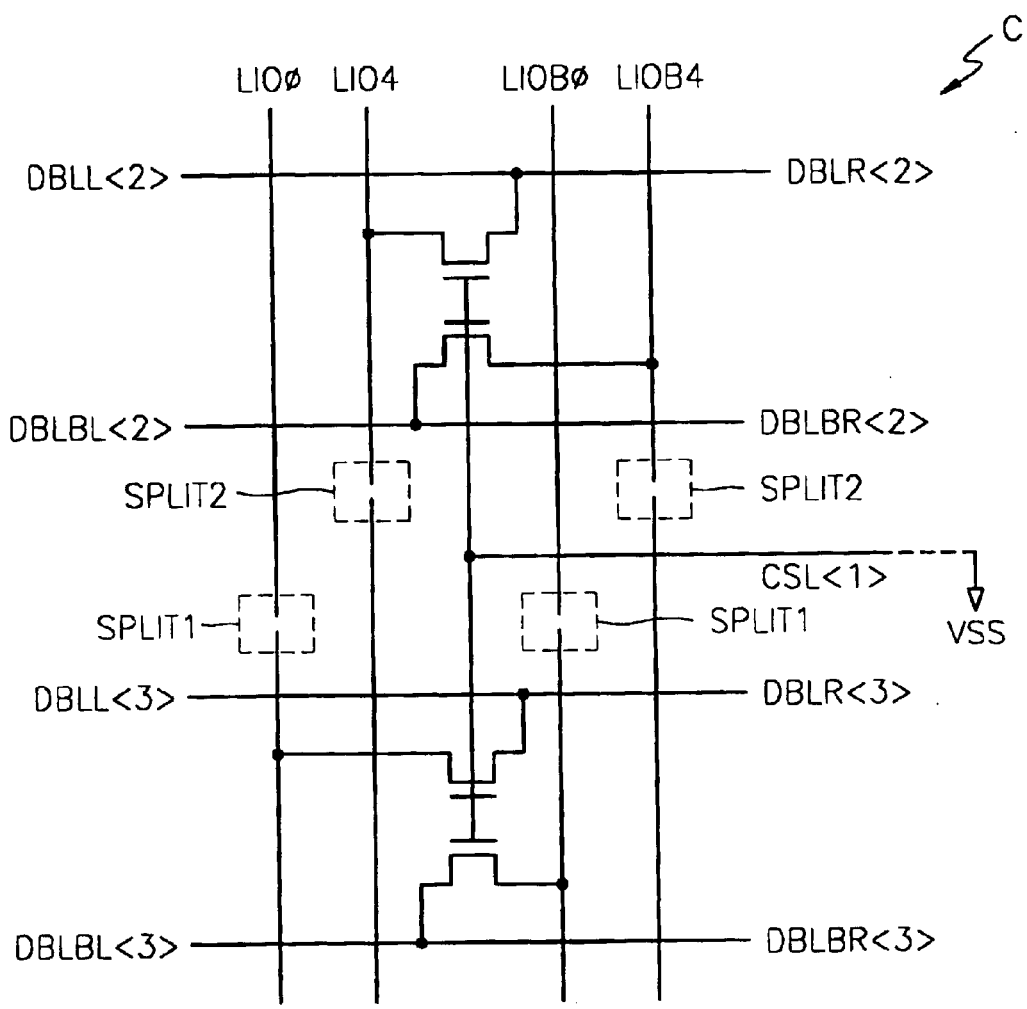
FIG. 7 is a detailed diagram of a portion of a semiconductor memory device in which pairs of local I/O lines shown in FIG. 6 are divided.

The portion of FIG. 6 identified by reference C is described with reference to FIG. 7. FIG. 7 is a detailed diagram of a portion of a sense amplifier area 30 in which pairs of local I/O lines shown in FIG. 6 are divided.

Referring to FIG. 7, local I/O line pairs ([LIO0, LIOB0], [L104, LIOB4]) are divided at SPLIT1 and SPLIT2, respectively. Thus, the semiconductor memory device according to particular embodiments of the present invention includes a dummy bit line sense amplifier area that provides an area for dividing the local I/O line pairs.

Figure 8:
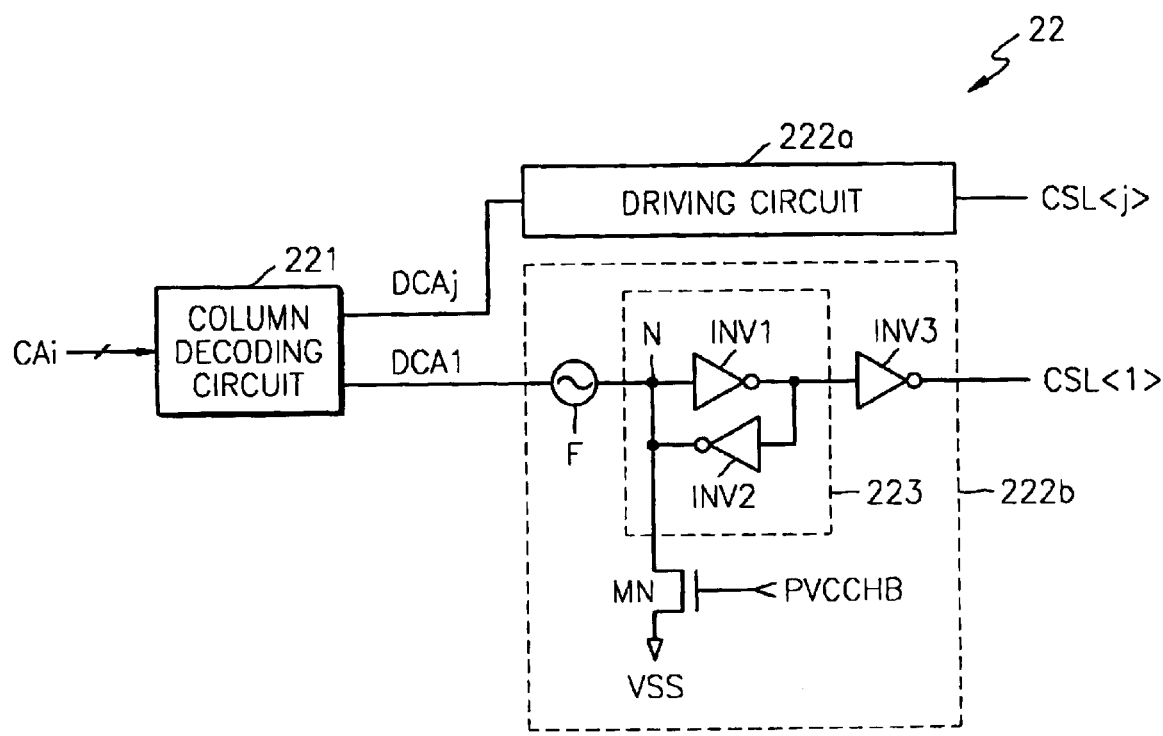
FIG. 8 is a diagram of embodiments of a column decoder such as may be used in the semiconductor memory device shown in FIG. 3.

FIG. 8 is a diagram of further embodiments of a column decoder shown in FIG. 3. Referring to FIG. 8, a column decoder 22 included in the a column decoding circuit 221 and driving circuits 222a and 222b. Each driving circuit 222a and 222b has a fuse (F), a latch circuit 223, an inverter (INV3), and an NMOS transistor (MN).

The NMOS transistor (MN), in response to a control signal (PVCCHB), pulls down the voltage level of the node (N) to the ground voltage (VSS). The control signal (PVCCHB) is a pulse that is activated to a "high" logic level for a predetermined time when power is provided to the semiconductor memory device. That is, the control signal (PVCCHB) is a signal indicating that power is provided to the semiconductor memory device.

The latch circuit 223 has two inverters (INV1, INV2) cross-coupled with each other. The latch circuit 223 latches the voltage level of the node (N) that was pulled down to the ground voltage (VSS). The inverter INV3 inverts the output signal of the latch circuit 223 and inactivates the column selection line (CSL<1>) to a "low" logic level.

The column decoding circuit 221 decodes the column address (CAi) and sends the decoding column address (DCA1) to the fuse (F). The fuse (F) is cut so as to keep the column selection line (CSL<1>) at a "low" logic level, and prevents the output signal of the column decoding circuit 221 from being sent to the node (N).

Also, the column decoding circuit 221 decodes the column address (CAi) and generates the decoding column address (DCAj). Here, j is "0" or a positive integer except "1". The driving circuit 222a has the same elements as those of the driving circuit 222b described above. However, the fuse (F) in the driving circuit 222a is not cut. Therefore, in response to the decoding column address (DCAj), the driving circuit 222a activates the column selection line (CSL<i>). Because the driving circuits 222a and 222b have the same elements, the continuity of the column decoder 22 is maintained.

Embodiments of the present invention have been described herein with reference to specific terminologies, however, the present invention should not be construed as limited to specific terms as these terms are used in a generic sense. While the present invention has been particularly shown and described with reference to specific embodiments thereof, it will be understood by those skilled in the art that various changes in form and details may be made therein without departing from the spirit and scope of the invention as defined by the appended claims.

What is claimed is:

1. A semiconductor memory array comprising:
   a memory cell array divided into a plurality of sub-arrays by sub-word line driver areas and bit line sense amplifier areas;
   local Input/Output (I/O) lines arranged in the bit line sense amplifier areas;
   global I/O lines arranged in the sub-word line driver areas, wherein at least one end of each of the local I/O lines is formed in a bit line sense amplifier area; and
   wherein the bit line sense amplifier areas include dummy bit line sense amplifier areas containing dummy bit line sense amplifiers and wherein at least one end of each of the local I/O lines is in a dummy bit line sense amplifier area.

2. The semiconductor memory device of claim 1, further comprising:
a first switching circuit responsive to a column selection signal that selectively connects or disconnects a respective local I/O line and a dummy bit line connected to the corresponding dummy bit line sense amplifier.

3. The semiconductor memory device of claim 2, wherein the first switching circuit disconnects the respective local I/O line and the dummy bit line connected to the dummy bit line sense amplifier in response to inactivation of the column selection line signal.

4. The semiconductor memory device of claim 2, wherein the local I/O line arranged in the bit line sense amplifier area is formed with a first divided local I/O line and a second divided local I/O line, and the first divided local I/O line is connected to a first global I/O line among the global I/O lines through a second switching circuit, and the second divided local I/O line is connected to a second global I/O line among the global I/O lines through a third switching circuit.

5. The semiconductor memory device of claim 4, further comprising:
a column decoder that generates a column selection signal.

6. The semiconductor memory device of claim 5, wherein the column decoder comprises:
a column decoding circuit configured to decode a column address provided to the semiconductor memory device; and
a plurality of driver circuits configured to selectively provide a corresponding column selection signal.

7. The semiconductor memory device of claim 6, wherein each of the plurality of driver circuits comprises:
a latch circuit that latches a logic value based on a voltage level of an input node;
a transistor, responsive to a control signal indicating that power is provided to the semiconductor memory device, that is configured to selectively pull down the voltage level of the input node of the latch circuit to a ground voltage;
an inverter configured to invert an output signal of the latch circuit as a column selection line signal; and
a fuse configured to selectively allow or prevent sending a signal output from the column decoding circuit to the input node of the latch circuit.

8. A semiconductor memory device comprising:
a memory cell array divided into a plurality of sub-arrays by sub-word line driver areas and bit line sense amplifier areas;
a plurality of sub-word lines arranged in each of the sub-arrays;
a plurality of normal bit line pairs arranged on each of the sub-arrays, respective ones of which perpendicularly intersect each of the sub-word lines;
a dummy bit line pair arranged in each of the sub-arrays, respective ones of which perpendicularly intersect each of the sub-word lines, the dummy bit line pairs being arranged in parallel with corresponding ones of the normal bit line pairs;
a plurality of dummy bit line sense amplifiers connected to corresponding ones of the dummy bit line pairs and arranged in a corresponding bit line sense amplifier area;

a plurality of local I/O line pairs, each of which is connected to a corresponding normal bit line pair and a corresponding dummy bit line pair through a respective one of a plurality of first switching circuits; and
a plurality of global I/O line pairs, each of which is connected to corresponding local I/O line pairs through a respective one of a plurality of second switching circuits,
wherein at least one end of each of the local I/O line pairs is formed in a corresponding one of the bit line sense amplifier areas.

9. The semiconductor memory device of claim 8, wherein each of the first switching circuits, in response to inactivation of the corresponding column selection line signal, disconnects corresponding ones of the dummy bit line pairs from the local I/O line pairs corresponding to the dummy bit line pair.

10. The semiconductor memory device of claim 9, wherein each of the local I/O line pairs arranged in the dummy bit line sense amplifier area is formed with first divided local I/O line pairs and second divided local I/O line pairs, and the first divided local I/O line pairs are connected to first global I/O line pairs among the global I/O line pairs through one of the second switching circuits, and the second divided local I/O line pairs are connected to second global I/O line pairs among the global I/O line pairs through one of the second switching circuits.

11. The semiconductor memory device of claim 10, further comprising:
a column decoder that generates a column selection line signal.

12. The semiconductor memory device of claim 11, wherein the column decoder comprises:
a column decoding circuit which decodes a column address provided to the semiconductor memory device; and
a plurality of driver circuits configured to selectively provide a corresponding column selection signal.

13. The semiconductor memory device of claim 12, wherein each of the plurality of driver circuits comprises:
a latch circuit that latches a logic value based on a voltage level of an input node;
a transistor, responsive to a control signal indicating that power is provided to the semiconductor memory device, that is configured to selectively pull down the voltage level of the input node of the latch circuit to a ground voltage;
an inverter configured to invert an output signal of the latch circuit as a column selection line signal; and
a fuse configured to selectively allow or prevent sending a signal output from the column decoding circuit to the input node of the latch circuit.

14. A semiconductor memory device comprising:
a memory cell array divided into a plurality of sub-arrays by bit line sense amplifier areas;
a plurality of sub-word lines arranged in the sub-arrays;
a plurality of normal bit line pairs which are arranged on the sub-arrays and perpendicularly intersect the sub-word lines;
a dummy bit line pair in each of the sub-arrays in parallel with the normal bit line pairs and configured to perpendicularly intersect the sub-word lines;
a plurality of dummy bit line sense amplifiers connected to corresponding ones of the dummy bit line pairs and arranged in corresponding ones of the bit line sense amplifier areas;

a plurality of local I/O line pairs, ones of the local I/O line pairs being connected to a normal bit line pair and a corresponding dummy bit line pair; and first switching circuits configured to selectively connect or disconnect corresponding ones of the local I/O line pairs and the dummy bit line pairs, wherein each of the local I/O line pairs is divided into first divided local I/O line pairs and second divided local I/O line pairs in a bit line sense amplifier area in which the dummy bit line sense amplifier is arranged, and each of the first switching circuits is controlled by a column selection line signal of a column selection line.

15. The semiconductor memory device of claim 14, wherein each of the first switching circuits includes at least two NMOS transistors.

16. The semiconductor memory device of claim 14, wherein the dummy bit line pair connected to the first divided local I/O line pairs and the dummy bit line pair connected to the second divided local I/O line pairs are arranged on an identical sub-array.

17. A semiconductor memory device comprising:
a memory cell array having a plurality of sub-arrays;
bit line sense amplifier areas between the sub-arrays; and
a first divided local I/O line in at least one of the bit line sense amplifier areas,
wherein an end of the first divided local I/O line is formed in the bit line sense amplifier area.

18. The semiconductor memory device of claim 17, wherein the at least one of the bit line sense amplifier areas includes a dummy bit line sense amplifier area.

19. The semiconductor memory device of claim 18, further comprising a second divided local I/O line.

20. The semiconductor memory device of claim 19, wherein an end of the second divided local I/O line is formed in the dummy bit line sense amplifier area.

21. The semiconductor memory device of claim 19, wherein an end of the first divided local I/O line and an end of the second divided local I/O line are arranged in the dummy bit line sense amplifier area.

22. The semiconductor memory device of claim 17, further comprising a sub-word line driver area at a periphery of the memory cell array.

* * * * *